United States Patent
Schelling et al.

(10) Patent No.: US 10,954,120 B2
(45) Date of Patent: Mar. 23, 2021

(54) MICROMECHANICAL SENSOR THAT INCLUDES A STRESS DECOUPLING STRUCTURE

(71) Applicant: Robert Bosch GmbH, Stuttgart (DE)

(72) Inventors: Christoph Schelling, Stuttgart (DE); Jochen Beintner, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 123 days.

(21) Appl. No.: 16/340,770

(22) PCT Filed: Sep. 25, 2017

(86) PCT No.: PCT/EP2017/074181
§ 371 (c)(1),
(2) Date: Apr. 10, 2019

(87) PCT Pub. No.: WO2018/069028
PCT Pub. Date: Apr. 19, 2018

(65) Prior Publication Data
US 2020/0048072 A1    Feb. 13, 2020

(30) Foreign Application Priority Data
Oct. 12, 2016   (DE) .......................... 10201621807.6

(51) Int. Cl.
*B81B 3/00*   (2006.01)
*B81C 1/00*   (2006.01)
(52) U.S. Cl.
CPC ........ *B81B 3/0072* (2013.01); *B81C 1/00666* (2013.01); *B81B 2201/0235* (2013.01);
(Continued)

(58) Field of Classification Search
CPC .......... B81B 3/0072; B81B 2201/0235; B81B 2201/0264; B81B 2203/0109; B81B 2203/0127; B81C 1/00666
(Continued)

(56) References Cited

U.S. PATENT DOCUMENTS 6,893,928 B2   5/2005   Sato et al.
7,170,140 B2   1/2007   Dutoit et al.
(Continued)

FOREIGN PATENT DOCUMENTS

DE   102014210945 A1   12/2015
EP   2871455 A1   5/2015

OTHER PUBLICATIONS

International Search Report for PCT/EP2017/074181, dated Dec. 14, 2017.
(Continued)

*Primary Examiner* — Thinh T Nguyen
(74) *Attorney, Agent, or Firm* — Norton Rose Fulbright US LLP; Gerard Messina

(57) ABSTRACT

A micromechanical sensor is described that includes: a substrate; a first functional layer that is situated on the substrate; a second functional layer that is situated on the first functional layer and that includes movable micromechanical structures; a cavity in the substrate that is situated below the movable mechanical structures; and a vertical trench structure that surrounds the movable micromechanical structures of the second functional layer and extends into the substrate down to the cavity.

9 Claims, 7 Drawing Sheets

(52) U.S. Cl.
CPC ............... *B81B 2201/0242* (2013.01); *B81B 2201/0264* (2013.01); *B81B 2203/0109* (2013.01); *B81B 2203/0127* (2013.01); *B81B 2203/033* (2013.01); *B81B 2203/0307* (2013.01); *B81B 2203/0315* (2013.01); *B81C 2201/017* (2013.01)

(58) Field of Classification Search
USPC ............ 257/419, 414.415, 417; 438/48.5, 53
See application file for complete search history.

(56) References Cited

U.S. PATENT DOCUMENTS

| | | |
|---|---|---|
| 7,843,025 B2 | 11/2010 | Benzel et al. |
| 2008/0236292 A1 | 10/2008 | Reijs |
| 2015/0122038 A1* | 5/2015 | Mayer et al. ........... G01L 7/024 73/215 |
| 2015/0232327 A1 | 8/2015 | Reinmuth |

OTHER PUBLICATIONS

I. Mizushima, et al., "Empty-Space-In-Silicon Technique for Fabricating a Silicon-On-Nothing Structure," Applied Physics Letters, vol. 77, No. 20, 2000, pp. 3290-3292.

* cited by examiner

MICROMECHANICAL SENSOR THAT INCLUDES A STRESS DECOUPLING STRUCTURE

FIELD OF THE INVENTION

The present invention relates to a micromechanical sensor. Moreover, the present invention relates to a method for manufacturing a micromechanical sensor.

BACKGROUND INFORMATION

Micromechanical inertial sensors for measuring acceleration and rotation rate are mass-produced for various applications in the automotive and consumer sectors. Present inertial sensors are sensitive to externally coupled mechanical stress, which may disadvantageously reduce their accuracy.

U.S. Pat. No. 7,170,140 provides a structure that allows extensive stress decoupling. However, the manufacture requires a costly layer transfer process.

A so-called silicon-on-nothing (SON) substrate that includes a cavity in the substrate, and a method for manufacturing a diaphragm are known from U.S. Pat. No. 6,893,928 and from I. Mizushima, T. Sato, S. Taniguchi, Y. Tsunashima, "Empty-space-in-silicon technique for fabricating a silicon-on-nothing structure," Applied Physics Letters, Vol. 77, No. 20, Nov. 13, 2000.

U.S. Pat. No. 7,843,025 provides surface micromechanical methods for manufacturing diaphragms.

A principle of stress decoupling trenches for micromechanical components is also known from German Published Patent Application No. 10 2014 210 945.

SUMMARY

An object of the present invention is to provide a micromechanical sensor that is improved with regard to external mechanical stress.

According to a first aspect, the object is achieved by a micromechanical sensor that includes:
  a substrate;
  a first functional layer that is situated on the substrate;
  a second functional layer that is situated on the first functional layer and that includes movable micromechanical structures;
  a cavity in the substrate that is situated below the movable mechanical structures; and
  a vertical trench structure that surrounds the movable micromechanical structures of the second functional layer and extends into the substrate down to the cavity.

In this way, a stress decoupling structure is provided for the micromechanical sensor which may prevent or greatly reduce an effect of externally acting stress on the sensor element, and thus, error signals. An improved mode of operation of the micromechanical sensor is advantageously assisted in this way. This is achieved essentially by creating pivotal or fulcrum points for the movable micromechanical structures so that the entire structure may twist, as the result of which the movable micromechanical structures remain essentially stationary, even under externally acting stress, and therefore do not generate electrical sensor error signals.

As a result, an improved stress decoupling of the electromechanical structure from the surrounding substrate is provided, so that it is possible to achieve highly sensitive micromechanical sensors.

According to a second aspect, the object is achieved by a method for manufacturing a micromechanical sensor, including the steps:
  providing a substrate with a cavity formed therein;
  forming a first functional layer on the substrate;
  forming a second functional layer that includes movable micromechanical structures on the first functional layer, the movable micromechanical structures being formed in an area of the second functional layer above the cavity; and
  forming a vertical trench structure around the movable micromechanical structures, into the substrate down to the cavity.

One advantageous specific embodiment of the micromechanical sensor is characterized in that a diaphragm that is formed in the first functional layer and delimited by the trench structure is vertically and/or laterally anchored on the substrate. Different fastening options for the diaphragm formed in the first functional layer are thus advantageously provided. Freedom of design for the stress decoupling structure is advantageously increased in this way.

Another advantageous specific embodiment of the micromechanical sensor provides that fixing elements of the movable micromechanical structures on the first functional layer and fixing elements of the first functional layer on the substrate are situated essentially one above the other. As a result, identical pivotal or fulcrum points are advantageously present for the movable micromechanical structures and for the electrode structure situated below same, thus essentially preventing error signals.

Other advantageous specific embodiments of the micromechanical sensor are characterized in that the cavity is provided by an APSM cavity or an SON cavity or by a cSOI substrate. Different options are thus advantageously provided to provide a cavity below the movable micromechanical structures. Freedom of design for the stress decoupling structure is advantageously increased in this way.

Another advantageous specific embodiment of the micromechanical sensor is characterized in that the vertical trench structure is bridged with the aid of a bridging element. For example, electrical feeding of the micromechanical structures may be advantageously achieved in this way.

Another advantageous specific embodiment of the micromechanical sensor is characterized in that the bridging element has a spring-like design. Favorable mechanical properties for the bridging element are provided in this way.

Another advantageous specific embodiment of the micromechanical sensor is characterized in that the micromechanical sensor is designed as an acceleration sensor, a rotation rate sensor, or a pressure sensor. In this way, different types of micromechanical sensors may be advantageously implemented with the aid of the principle according to the present invention.

The present invention is described in greater detail below with further features and advantages, with reference to several figures. Identical or functionally equivalent elements have the same reference numerals. The figures are in particular intended to explain the principles that are essential to the present invention, and are not necessarily illustrated true to scale. For better clarity, it may be provided that not all reference numerals are provided in all figures.

Provided method features analogously result from corresponding provided device features, and vice versa. This means in particular that features, technical advantages, and statements regarding the method for manufacturing a micromechanical sensor analogously result from corresponding statements, features, and advantages of the micromechanical sensor, and vice versa.

DETAILED DESCRIPTION

A core concept of the present invention is the provision of a stress decoupling structure for a micromechanical sensor. The provided architecture and the associated method for manufacturing the micromechanical sensor result in extensive stress decoupling of the MEMS structure from the surrounding substrate, and thus allow highly sensitive micromechanical inertial components to be provided.

The integration environment (circuit board, for example) and the packaging of an inertial component (molded housing, for example), due to different thermal coefficients of expansion of the materials used, generally couple mechanical stress into micromechanical inertial components, which may result in deformations. When the temperature changes, changes in these deformations occur that result in measured error signals and disadvantageously reduce the accuracy of the inertial components.

The provided micromechanical sensor may advantageously be used, for example, for infrared sensor arrays, acceleration sensors, rotation rate sensors, pressure sensors, and combinations of the above-mentioned sensors in sensor clusters.

Figure 1:
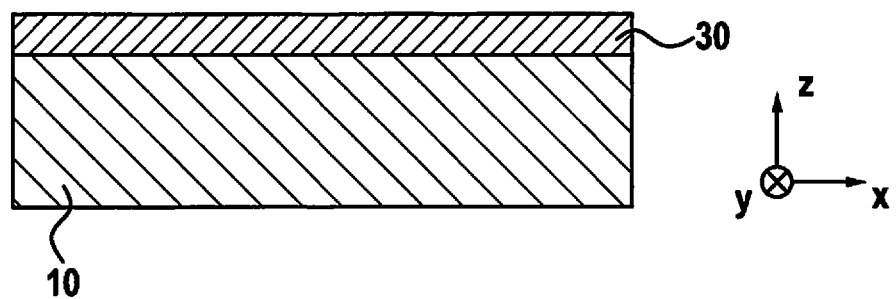
FIG. 1 shows a schematic illustration of a conventional micromechanical sensor without external stress.

FIG. 1 schematically shows a conventional micromechanical inertial sensor that includes a substrate 10 on which a first functional layer 20 (not illustrated) and a second functional layer 30 with movable micromechanical structures (not illustrated) are situated. A situation is shown that has no externally acting mechanical stress, in which the component is not deformed, and the plane of the movable micromechanical structures and substrate 10 have an essentially planar design.

Figure 2:
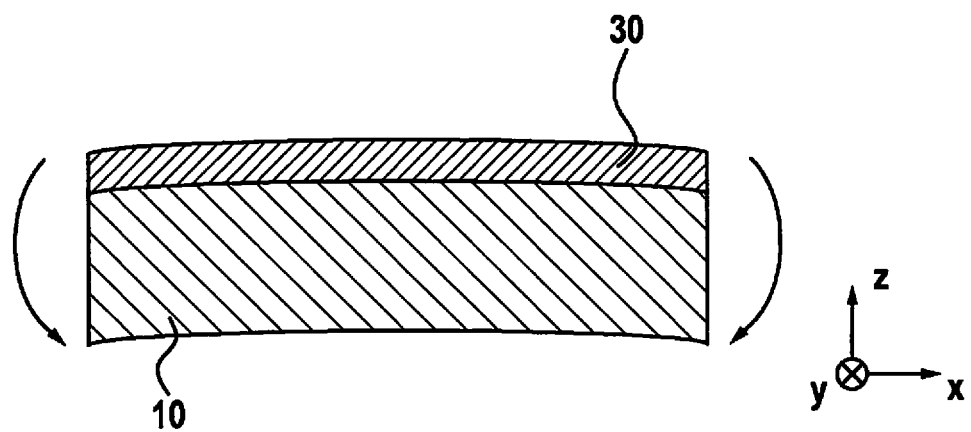
FIG. 2 shows a schematic illustration of the conventional micromechanical sensor with external stress.

FIG. 2 shows a situation of the conventional arrangement from FIG. 1 with externally acting stress, whose effect is indicated by two curved arrows. In this case, the component is deformed primarily in the z direction, with exposed structures not being deformed, whereas functional elements (rigid detection electrodes, not illustrated) anchored directly on the substrate 10 are deformed. This results in a geometric shift between exposed functional elements and vertically anchored functional elements, which is detected as an undesirable electrical error signal.

Figure 3:
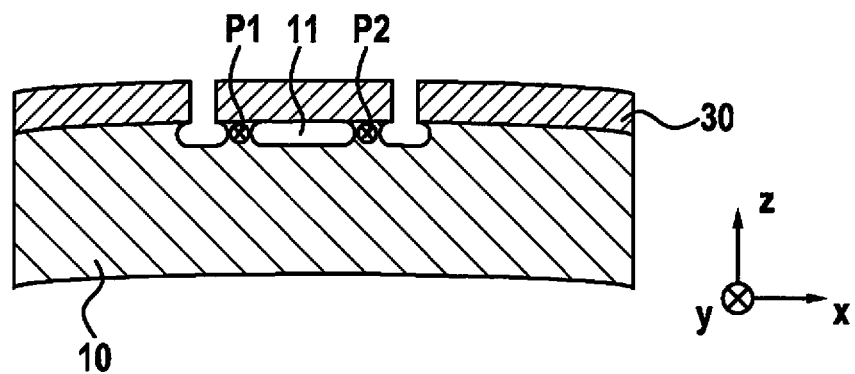
FIG. 3 shows a schematic illustration of a functional principle of the micromechanical sensor according to the present invention.

FIG. 3 shows a schematic illustration of the provided architecture. Vertical anchorings of a so-called "diaphragm" on substrate 10 and a cavity 11 that is formed in substrate 10 below the diaphragm are provided. As a result, pivotal or fulcrum points P1, P2 are created, about which substrate 10 may bend or twist with respect to the diaphragm, as the result of which the deformation of substrate 10 is not transmitted to the diaphragm surface. As a result, second functional layer 30 including the movable micromechanical structures remains essentially stationary, and thus is advantageously not bent by externally acting mechanical stress. When the arrangement bends, advantageously very few, or no, electrical error signals are generated.

Figure 4:
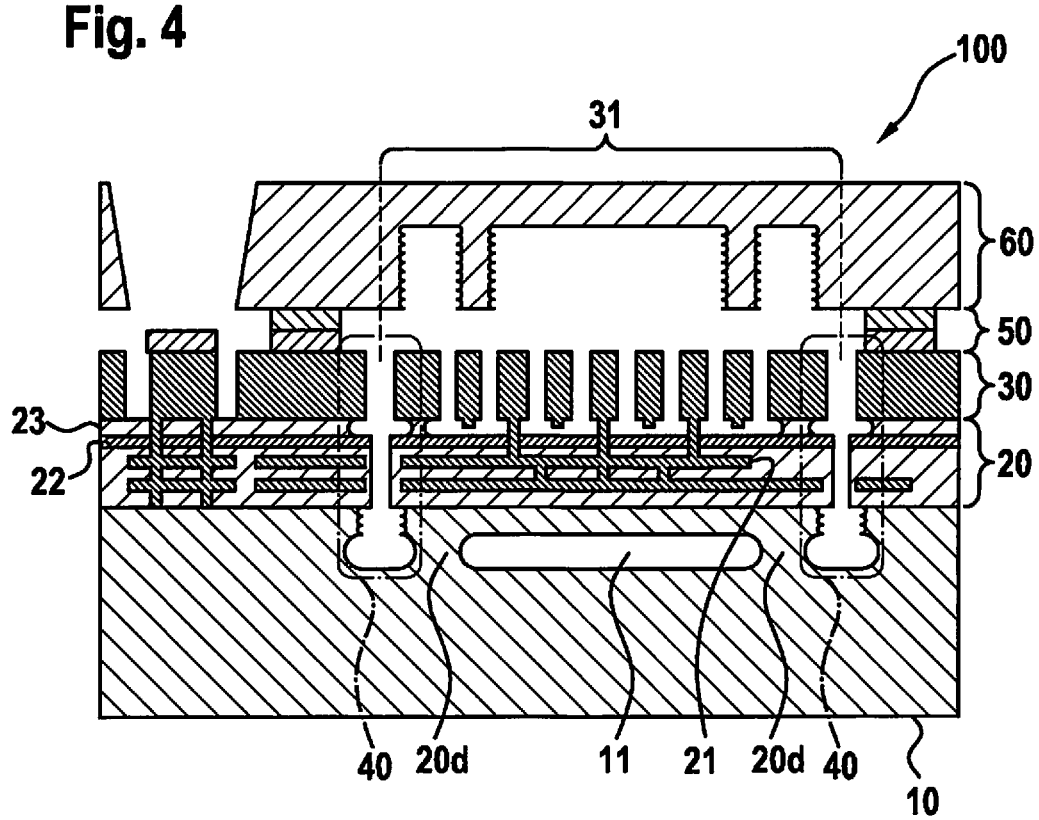
FIG. 4 shows a cross-sectional view of one specific embodiment of the micromechanical sensor according to the present invention.

FIG. 4 shows a schematic cross-sectional view of a first specific embodiment of provided micromechanical sensor 100. A substrate 10, on which a first functional layer 20 is situated, is apparent, one or multiple electrodes 21 being situated in first functional layer 20. An etch stop layer 22 and an oxide layer 23 are situated within first functional layer 20. Situated on first functional layer 20 is a second functional layer 30 in which movable micromechanical structures 31 (MEMS structures) are formed which cooperate with electrode 21 of first functional layer 20 and generate an electrical measuring signal of micromechanical sensor 100 during a defined movement of movable structures 31.

A cavity 11 is formed in substrate 10, which may be provided by various processes known per se, for example in the form of an advanced porous silicon membrane (APSM) diaphragm or a silicon-on-nothing (SON) diaphragm or by use of a cavity substrate on insulator (cSOI) substrate.

A vertical trench structure 40 that surrounds movable micromechanical structures 31, and which penetrates first functional layer 20 and extends into substrate 10 approximately to the level of cavity 11, is formed. In this way, a diaphragm is created in a section of first functional layer 20 together with a section of substrate 10, and is vertically anchored on remaining substrate 10 on four support elements 20d.

Thus, with the aid of vertical trench structure 40, four pivotal or fulcrum points are provided for the stated diaphragm, about which substrate 10 may rotate without twisting movable micromechanical structures 31 that are situated on the stated diaphragm. As a result, mechanical decoupling of movable micromechanical structures 31 from substrate 10 is achieved, thus increasing mechanical insensitivity of the micromechanical sensor 100 due to the fact that electrical error signals on account of mechanical stress externally acting on sensor 100 are largely avoided. The described vertical anchoring of the diaphragm on substrate 10 has the advantage that no in-plane-stress is coupled into movable micromechanical structures 31.

Diaphragm area M is thus laterally delimited from a surrounding stress isolation trench or stress decoupling trench that is spanned only by electrical feed line elements (not illustrated). As a result of the anchoring diaphragm, out-of-plane bending moments of the substrate due to the lack of force transmission are not relayed to MEMS elements 31.

Alternatively, it would also be conceivable to laterally anchor the stated diaphragm on substrate 10 (not illustrated).

With the aid of a bonding frame 50, a cap wafer 60 is situated on second functional layer 30 via a bond connection.

A process flow for manufacturing one specific embodiment of micromechanical sensor 100 is explained below with reference to FIGS. 5 through 11. A more detailed description of the process control is dispensed with here, since these are process steps, known per se, of standard methods in surface micromechanics.

Figure 5:
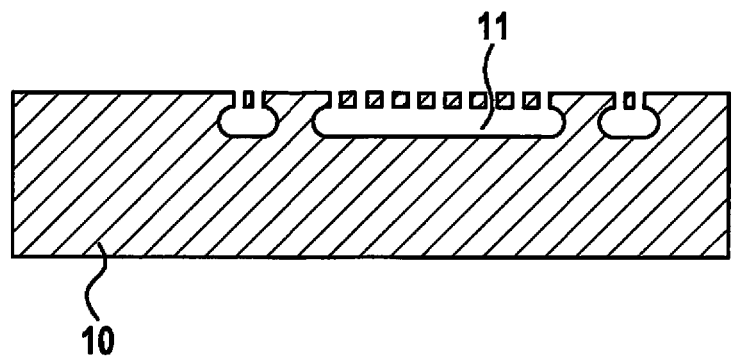
FIGS. 5 through 11 show a process flow for manufacturing a specific embodiment of the micromechanical sensor according to the present invention.

FIG. 5 shows a cross-sectional view of a substrate 10 in which a cavity 11 is formed. A grid-like structure is formed in substrate 10 by an anisotropic and optionally an isotropic etching process, with the aid of a known surface micromechanical process such as an APSM process or an SON process.

Figure 6:
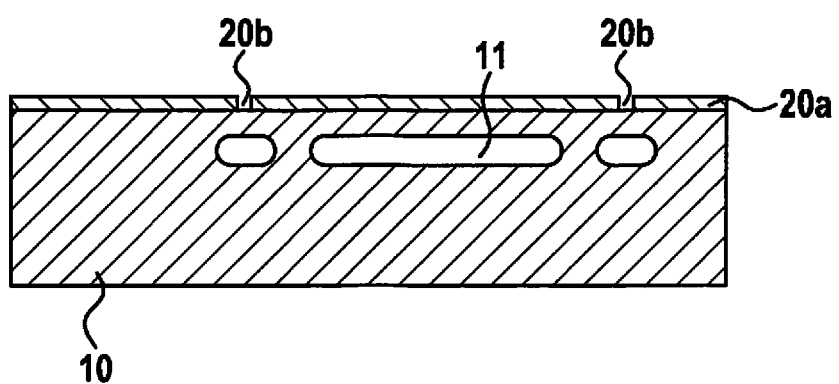

FIG. 6 shows a closure of the grid by epitaxy or by a thermal reflow process. This is followed by deposition of an oxide layer 20a and formation of substrate contact holes 20b. An oxide grid is subsequently created in the area intended for the future stress isolation trenches, whose basic structures as cavities below the substrate contact holes 20b are discernible.

Figure 7:
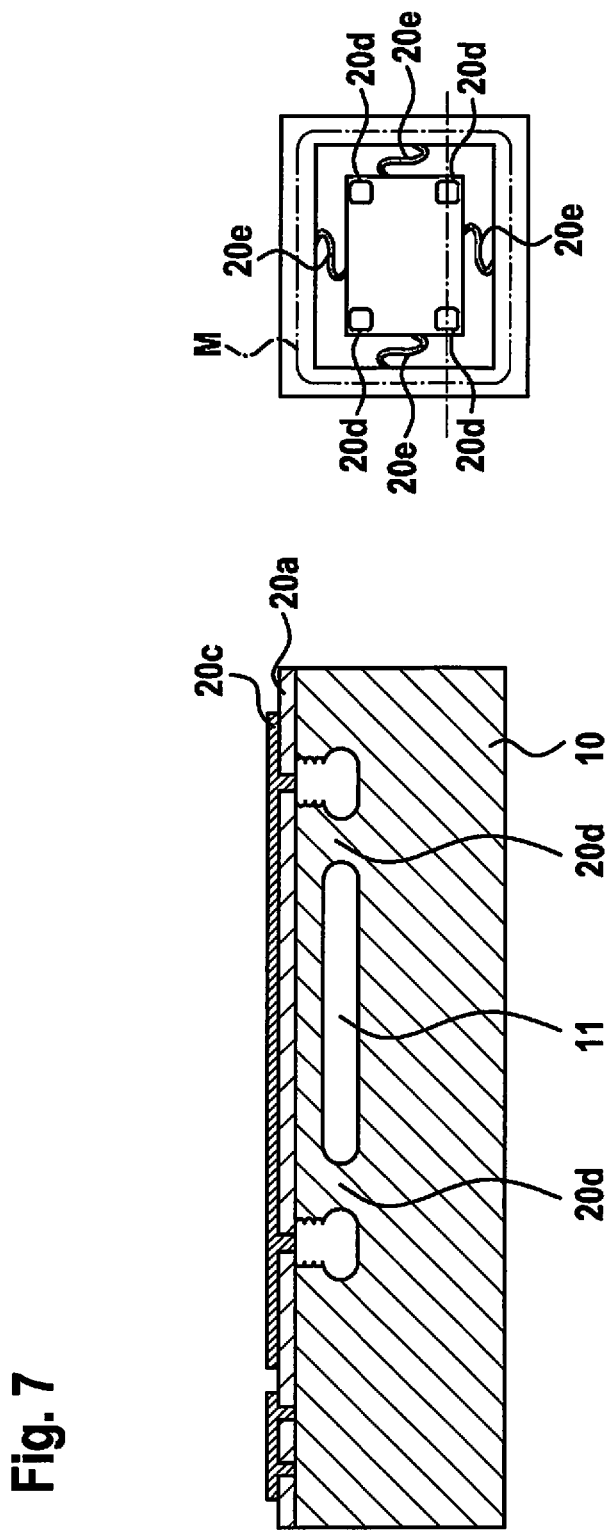

The cross-sectional view in FIG. 7 indicates that a trench has been made through the oxide grid, and preferably a polysilicon layer 20c has been deposited on the oxide grid. This is followed by structuring of electrical wiring lines. A top view onto diaphragm area M is apparent in the right section of FIG. 7, with support pillars 20d of the diaphragm and spring-like bridging elements 20e, via which an electrical connection of the micromechanical structures is established, being discernible. A section plane indicated by two support pillars 20d corresponds to the sectional view of the left area of FIG. 7.

The spring-like structure of bridging elements 20e advantageously results in high flexibility to ensure the best possible stress decoupling. Alternatively, however, other web shapes such as multiple meanders would also be conceivable here. It is also conceivable to provide a spring bar at each of various sides of the diaphragm (top and bottom, for example).

Figure 8:
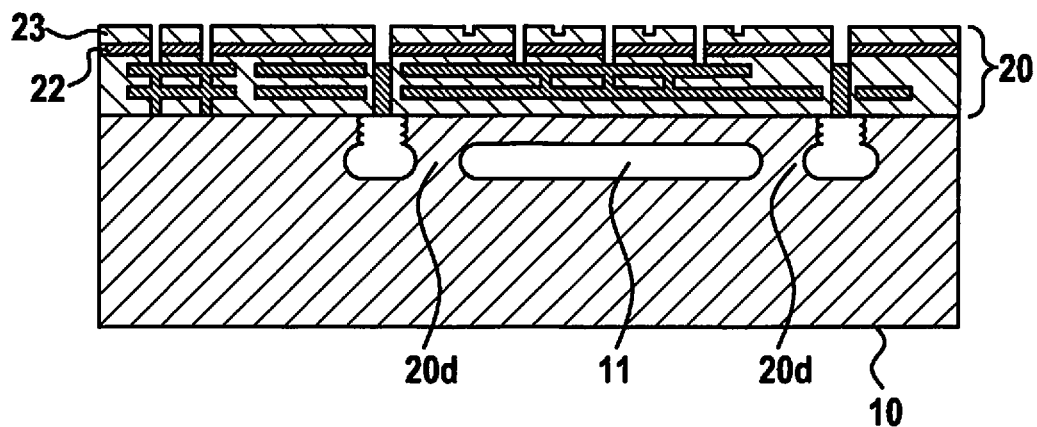

In FIG. 8 it is apparent that first functional layer 20 is completed by depositing and structuring additional functional planes. Deposition of an etch stop layer 22 for the subsequent sacrificial layer etching, and deposition of an oxide layer or sacrificial layer 23 optionally take place. This is followed by structuring of oxide layer 23 and optionally etch stop layer 22.

Figure 9:
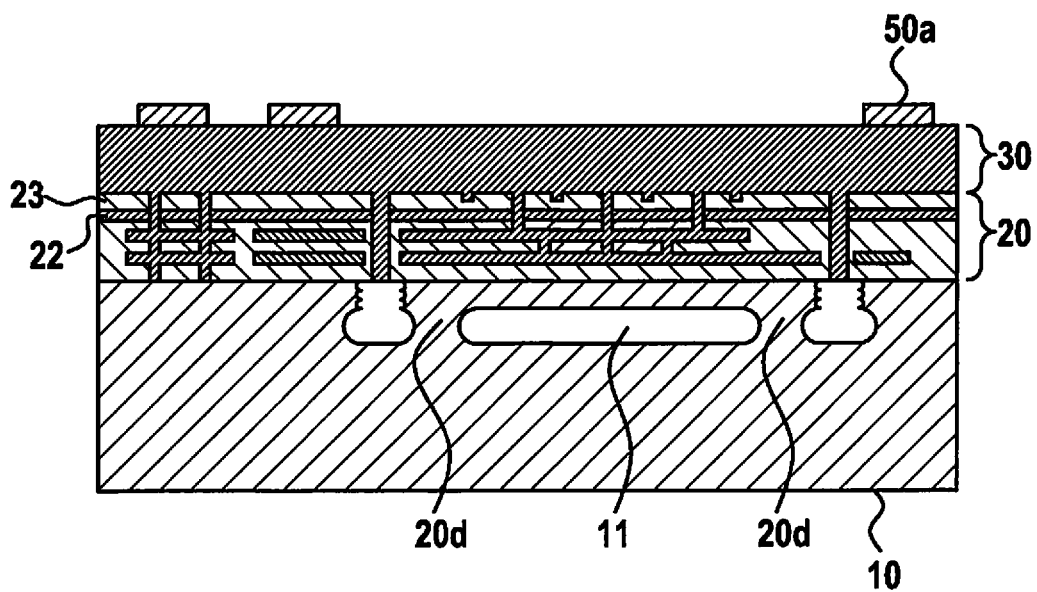

Deposition of a second functional layer 30, preferably in the form of polycrystalline silicon, is apparent in FIG. 9. This is followed by deposition of a first metal plating level 50a (aluminum, for example) for bond pads and as bond metal plating for a bond interface 50 to be subsequently formed.

Figure 10:
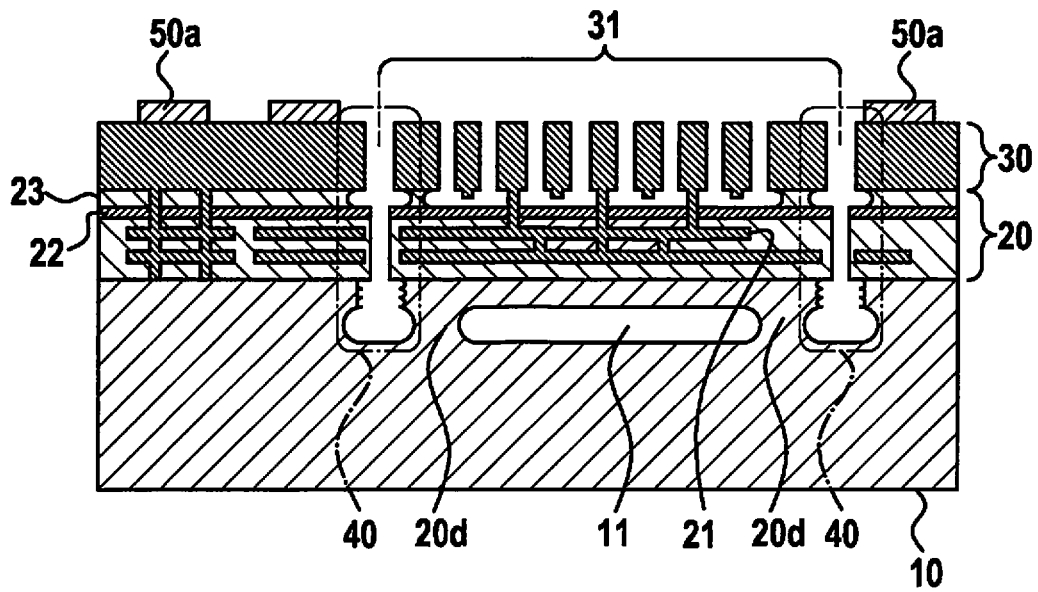

The cross-sectional view in FIG. 10 indicates that second functional layer 30 is structured, thus forming micromechanical structures 31. In addition, the mechanical functional areas are exposed, and vertical trench structure 40 described above is produced by sacrificial layer etching.

Figure 11:
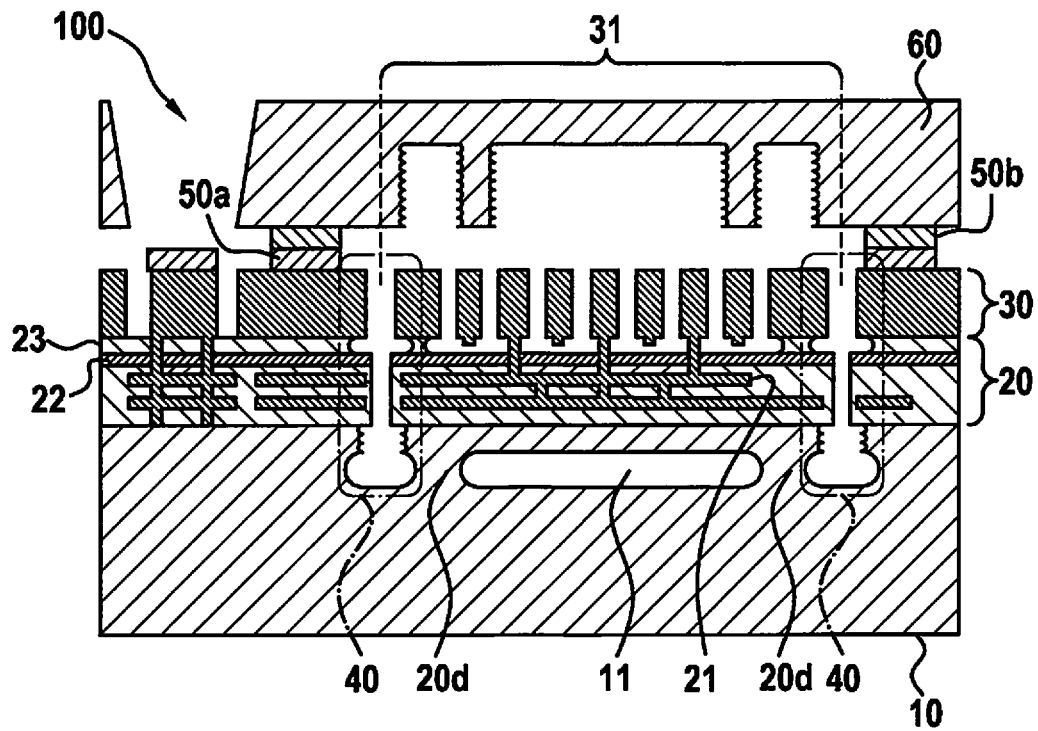

FIG. 11 shows the result of final capping of the entire structure by wafer bonding, and exposing and isolating bond pads by etching. The wafer bonding process is preferably a metallic bonding process, since via such a bonding process the intent is not only to ensure seal-tightness of the sensor cavity (cap cavity) around the diaphragm area, but also to ensure the electrical chip-to-chip contacts between first and second functional layers 20, 30. Examples of suitable metallic bonding processes are Al—Ge, Au—Si, Cu—Sn, Al—Al, Cu—Cu, and Au—Au. Stops for avoiding sticking are also provided. A cap cavity is formed within the cap wafer.

Figure 12:
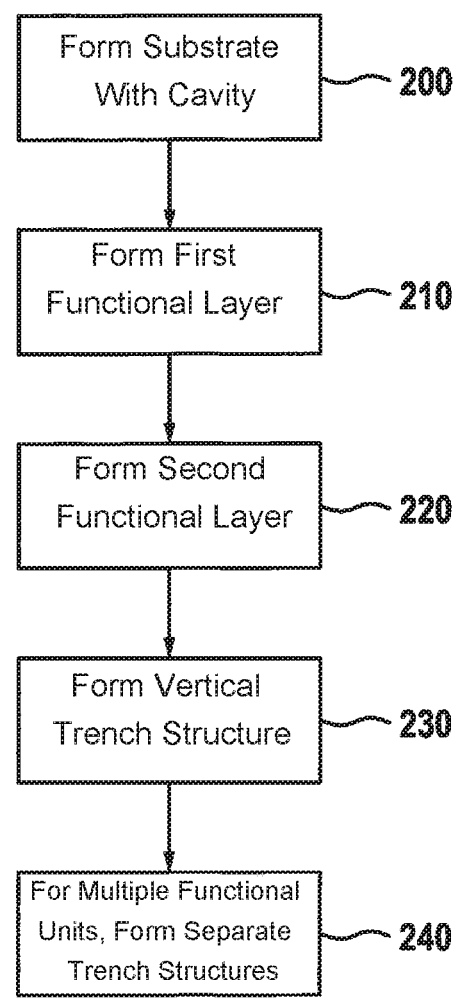
FIG. 12 shows a schematic sequence of a method for manufacturing a micromechanical sensor according to the present invention.

FIG. 12 shows a schematic sequence of a method for manufacturing a micromechanical structure.

A substrate 10 with a cavity 11 formed therein is provided in a step 200.

A first functional layer 20 is formed on substrate 10 in a step 210.

A second functional layer 30 with movable micromechanical structures 31 is formed on first functional layer 20 in a step 220, movable micromechanical structures 31 being formed in an area of second functional layer 30 above cavity 11.

A vertical trench structure 40 around movable micromechanical structures 31, into the substrate down to cavity 11, is formed in a step 230.

In the case that micromechanical sensor 100 includes multiple sensor functional units, a separate vertical trench structure 40 is preferably formed for each sensor functional unit, so that entire sensor arrays are advantageously stress-decoupled.

Although the present invention has been described above with reference to specific application examples, those skilled in the art may also implement specific embodiments that are not disclosed or only partly disclosed above, without departing from the core of the present invention.

What is claimed is:

1. A micromechanical sensor, comprising:
   a substrate;
   a first functional layer situated on the substrate;
   a second functional layer situated on the first functional layer and including movable micromechanical structures;
   a cavity in the substrate that is situated below the movable mechanical structures;
   a vertical trench structure that surrounds the movable micromechanical structures of the second functional layer and extends into the substrate down to the cavity; and
   a diaphragm that is at least one of vertically anchored and laterally anchored on the substrate, wherein the diaphragm is formed in the first functional layer and delimited by the trench structure.

2. The micromechanical sensor as recited in claim 1, further comprising:
   situating fixing elements of the movable micromechanical structures on the first functional layer, wherein the fixing elements of the first functional layer on the substrate are situated essentially one above the other.

3. The micromechanical sensor as recited in claim 1, wherein the cavity is provided by one of an APSM cavity, an SON cavity, and a cSOI substrate.

4. The micromechanical sensor as recited in claim 1, further comprising:
   a bridging element for bridging the vertical trench structure.

5. The micromechanical sensor as recited in claim 4, wherein the bridging element includes a spring-like form.

6. The micromechanical sensor as recited in claim 1, wherein the micromechanical sensor is designed as one of an acceleration sensor, a rotation rate sensor, and a pressure sensor.

7. A method for manufacturing a micromechanical sensor, comprising:
   providing a substrate with a cavity formed therein;
   forming a first functional layer on the substrate;
   forming a second functional layer that includes movable micromechanical structures formed in an area of the second functional layer above the cavity;
   forming a vertical trench structure around the movable micromechanical structures, into the substrate down to the cavity; and
   forming a diaphragm that is at least one of vertically anchored and laterally anchored on the substrate, wherein the diaphragm is formed in the first functional layer and delimited by the trench structure.

8. The method as recited in claim 7, wherein the micromechanical sensor is designed as one of a micromechanical rotation rate sensor, a micromechanical acceleration sensor, and a micromechanical pressure sensor.

9. The method as recited in claim 7, further comprising:
multiple functional units,
the vertical trench structure is formed for one of the multiple functional units, and
a plurality of additional vertical trench structures, each vertical trench structure being formed for a respective one of a remainder of the multiple functional units.

* * * * *

UNITED STATES PATENT AND TRADEMARK OFFICE
CERTIFICATE OF CORRECTION

PATENT NO. : 10,954,120 B2
APPLICATION NO. : 16/340770
DATED : March 23, 2021
INVENTOR(S) : Christoph Schelling and Jochen Beintner Page 1 of 1

It is certified that error appears in the above-identified patent and that said Letters Patent is hereby corrected as shown below:

On the Title Page

Item [30], replace:
"DE10201621807.6"
With:
-- DE 10 2016 219 807.6 --

Signed and Sealed this
First Day of June, 2021

Drew Hirshfeld
*Performing the Functions and Duties of the*
*Under Secretary of Commerce for Intellectual Property and*
*Director of the United States Patent and Trademark Office*